United States Patent
Wei et al.

(10) Patent No.: US 12,334,403 B2
(45) Date of Patent: Jun. 17, 2025

(54) MEASURING METHOD OF RESISTIVITY OF A WAFER

(71) Applicants: Zing Semiconductor Corporation, Shanghai (CN); SHANGHAI INSTITUTE OF MICROSYSTEM AND INFORMATION TECHNOLOGY, CHINESE ACADEMY OF SCIENCES, Shanghai (CN)

(72) Inventors: Xing Wei, Shanghai (CN); Minghao Li, Shanghai (CN); Zhongying Xue, Shanghai (CN)

(73) Assignees: Zing Semiconductor Corporation, Shanghai (CN); SHANGHAI INSTITUTE OF MICROSYSTEM AND INFORMATION TECHNOLOGY CHINESE ACADEMY OF SCIENCES, Shanghai (CN)

( * ) Notice: Subject to any disclaimer, the term of this patent is extended or adjusted under 35 U.S.C. 154(b) by 591 days.

(21) Appl. No.: 17/545,742

(22) Filed: Dec. 8, 2021

(65) Prior Publication Data

US 2023/0040616 A1    Feb. 9, 2023

(30) Foreign Application Priority Data

Aug. 9, 2021 (CN) .......................... 202110910092.7

(51) Int. Cl.
*H01L 21/66* (2006.01)
*G01R 27/02* (2006.01)

(52) U.S. Cl.
CPC ............ *H01L 22/14* (2013.01); *G01R 27/02* (2013.01)

(58) Field of Classification Search
CPC .................................................... H01L 22/14
See application file for complete search history.

(56) References Cited

U.S. PATENT DOCUMENTS

| 4,344,815 A | * | 8/1982 | Cazarra | ................ | G01N 27/041 |
| | | | | | 257/E21.321 |
| 7,078,919 B2 | * | 7/2006 | Prussin | .............. | G01R 31/2648 |
| | | | | | 438/18 |

(Continued)

FOREIGN PATENT DOCUMENTS

| CN | 101728262 A | 6/2010 |
| CN | 109307804 A | 2/2019 |

(Continued)

OTHER PUBLICATIONS

Japanese Office Action, dated Mar. 22, 2023 in a counterpart Japanese patent application, No. JP 2021-198945.

(Continued)

*Primary Examiner* — William A Harriston
(74) *Attorney, Agent, or Firm* — Chen Yoshimura LLP

(57) ABSTRACT

The invention provides a measuring method of resistivity of a wafer, comprising: choosing a wafer to be measured, conducting a thermal treatment for the wafer to remove a thermal donor in the wafer, conducting an oxidation process for the wafer to form an oxidized surface on the wafer, and measuring resistivity of the wafer. In the method, firstly, the wafer is oxidized to get the oxidized surface, so as to restrict surface variation when placing the wafer in a later process. Therefore, the resistivity measurement of the wafer surface only slightly varies.

8 Claims, 2 Drawing Sheets

(56) References Cited

U.S. PATENT DOCUMENTS

| | | | |
|---|---|---|---|
| 2005/0052191 A1* | 3/2005 | Prussin | G01R 31/2648 |
| | | | 324/719 |
| 2012/0032699 A1* | 2/2012 | Fukuhara | G01R 31/52 |
| | | | 324/762.05 |
| 2014/0379276 A1* | 12/2014 | Hoshi | H10D 62/834 |
| | | | 702/23 |
| 2020/0002835 A1* | 1/2020 | Hudson | C30B 29/06 |
| 2020/0199773 A1* | 6/2020 | Lee | C30B 33/00 |
| 2020/0199774 A1* | 6/2020 | Lee | C30B 15/20 |
| 2020/0343149 A1 | 10/2020 | Makise et al. | |
| 2022/0146444 A1* | 5/2022 | Kume | G01N 1/34 |

FOREIGN PATENT DOCUMENTS

| | | |
|---|---|---|
| EP | 3435409 A1 | 1/2019 |
| JP | 2002-076080 A | 3/2002 |
| JP | 2006-203026 A | 8/2006 |
| JP | 2010-165832 A | 7/2010 |
| JP | 2015-026755 A | 2/2015 |
| JP | 2019-129223 A | 8/2019 |
| JP | 2020-145306 A | 9/2020 |
| WO | 2020/139584 A8 | 7/2020 |

OTHER PUBLICATIONS

Chinese Office Action, dated Apr. 15, 2023, and Search Report dated Apr. 7, 2023, in a counterpart Chinese patent application, No. CN 202110910092.7.

Chinese Office Action, dated Oct. 28, 2023, in a counterpart Chinese patent application, No. CN 202110910092.7.

* cited by examiner

MEASURING METHOD OF RESISTIVITY OF A WAFER

FIELD OF THE INVENTION

The present invention generally relates to a technical field of manufacturing monocrystalline silicon, and specifically, relates to a measuring method of resistivity of a wafer.

BACKGROUND OF THE INVENTION

Monocrystalline silicon grown by CZ (Czochralski) method is broadly used to manufacture semiconductor electronic devices. Silicon crystal having various resistivity may be grown with doping process. Wafers for making devices such as insulated gate bipolar transistors (IGBT), those have low power and low leakage or devices for advanced wireless communication must have high resistivity (greater than 500 ohm-cm). Such wafer may retard effect of parasitic capacitance between the devices so as to increase device density on the surface of the wafer and lower power consumption of signals between the devices.

Monocrystalline silicon having high resistivity may be formed with/without doping slight dopant in polycrystalline silicon raw material. If the resistivity is higher, resistivity measurement is more difficult. Therefore, time variation of measurement of the resistivity exists when performing resistivity measurement with a four-point probe (4PP) method.

Thus, resistivity measurement needs to be improved to solve the problem as mentioned above.

SUMMARY OF THE INVENTION

Aiming on the problem of the current technology, the present invention provides a measuring method of resistivity of a wafer to solve the problems of requiring for a long period to stabilize measurement of resistivity due to time variation of the resistivity and failing to rapidly measure stable resistivity of the wafer has high resistivity. The measuring method comprises choosing a wafer to be measured, conducting a thermal treatment for the wafer to remove a thermal doner in the wafer, conducting an oxidation process for the wafer to form an oxidized surface on the wafer, and measuring resistivity of the wafer.

In an embodiment of the invention, optionally, the thermal treatment may be a rapid thermal treatment at a temperature range of 750° C.-1250° C.

In an embodiment of the invention, optionally, the thermal treatment may last for 30 sec to 50 sec.

In an embodiment of the invention, optionally, the oxidation process may comprise low temperature heating-up the wafer for a short period to form the oxidized surface on the wafer.

In an embodiment of the invention, optionally, the oxidation process may be conducted at 50° C. to 300° C.

In an embodiment of the invention, optionally, the oxidation process may last for 5 min to 3 hr.

In an embodiment of the invention, optionally, a step of cooling the wafer until a room temperature may be performed after conducting the oxidation process.

In an embodiment of the invention, optionally, the resistivity of the wafer is measured with a collinear four-point probe (4PP) method.

In an embodiment of the invention, optionally, the wafer may be a monocrystalline wafer.

In an embodiment of the invention, optionally, the resistivity of the wafer may exceed 500 ohm-cm.

To solve the current technical problem, the invention provides a measuring method of resistivity of a wafer to firstly conduct an oxidation process for the wafer for a short period and low temperature to form the oxidized surface on the wafer, so as to restrict surface variation when placing the wafer in a later process. Therefore, the resistivity measurement of the wafer surface only slightly varies. The present invention greatly shortens time to stabilize the measurement of resistivity, and therefore may stably measure the resistivity of the wafer in a fast and precise way.

BRIEF DESCRIPTION OF THE DRAWINGS

Various objects and advantages of the present invention will be more readily understood from the following detailed description when read in conjunction with the appended drawing, in which.

DESCRIPTION OF EMBODIMENTS OF THE INVENTION

Figure 1:
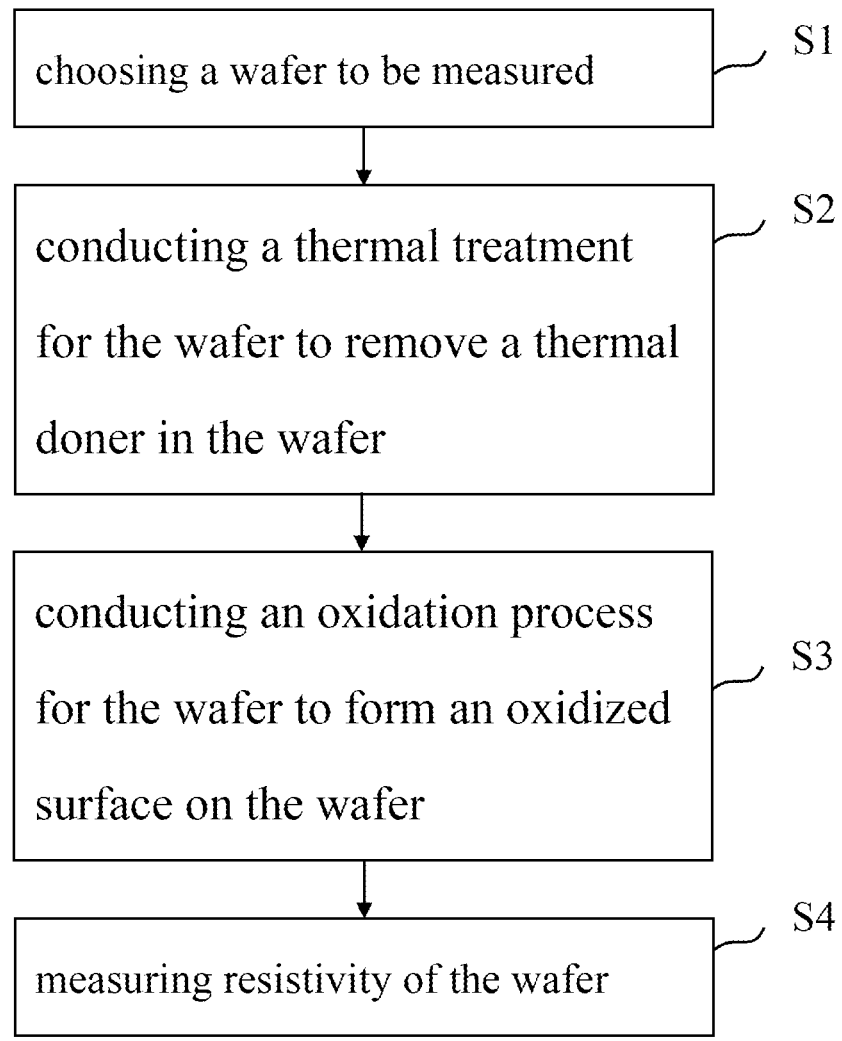
FIG. 1 shows a flow chart of a measuring method of resistivity of a wafer in an embodiment according to the invention.

Reference is now made to the following examples taken in conjunction with the accompanying drawings to illustrate detailed implementation of the present invention. Persons of ordinary skill in the art having the benefit of the present disclosure will implement the present invention without at least one of the details disclosed here. Please note that common knowledge in the art may not be illustrated here to avoid from obscurity.

The present disclosure illustrates various aspects of the embodiments according to the present invention, which may be implemented in various ways. Please note that embodiments described here are only for example and those skilled in the art should understand that any one of the aspects may not be limited to them. With the disclosure of the embodiments, those skilled in the art may readily understand the scope of the present invention. Please also note that the figures provided here are only exemplary. Only elements relative to the invention are shown therein. Actual number, shape, sizes, type and proportion may be varied in an implementation. For clarity, sizes or relative sizes of layers, regions, etc. may be exaggerated. The same reference number designates the same element. Layout or arrangement may be more complicated.

Yet further, the following description provides details for readily understanding the example; however, those skilled in the art will understand how to implement an aspect of the present invention without these specific details.

Please note that elements, parts, areas, layers and/or portions may be described with terms of "first," "second," "third," which are not used to limit these elements, parts, areas, layers and/or portions. These terms are only for distinguishing one element, part, area, layer and/or portion and another. Therefore, a first element, parts, area, layer or portion may be indicated with a second element, parts, area, layer or portion.

Please also note that terms to illustrate spatial relation used here, such as "below," "under," "lower than," "on," "above," etc., are taken to describe a relation between an element or feature and other element(s) or feature(s). It is readily to be understood that such geographic terms comprise other direction(s) of operation of a device not shown in the figures.

Terminology used here is only for description but not intended to limit the present invention. Unless a clear rule or definition is given, terms of "a," "an," and "the/said" comprise plural form of object. Terms of "comprise," "consist of," "have," "contain" and its varieties may be interpreted in a broad way to confirm existence of listed feature, step, operation, element and/or part, all equivalents and other unlisted objects. In addition, a term of "and/or" comprises any and all listed combinations.

Here, because a cross-sectional view of ideal embodiments (internal structure) is taken for example to describe the present invention, shape variation due to manufacture technologies and/or tolerance may be predicted. Thus, the embodiments may not be limited to the specific shape of area shown here, but comprise shape deviation. Please note the shown area is only for example but not intended to limit the scope of the present invention.

The present invention provides a measuring method of resistivity of a wafer to solve the problems of requiring for a long period to stabilize measurement of resistivity due to time variation of the resistivity and failing to rapidly measure stable resistivity of the wafer has high resistivity. As shown in FIG. 1, the measuring method comprises: step S1: choosing a wafer to be measured, step S2: conducting a thermal treatment for the wafer to remove a thermal doner in the wafer, step S3: conducting an oxidation process for the wafer to form an oxidized surface on the wafer, and step S4: measuring resistivity of the wafer.

To solve the current technical problem, the invention provides a measuring method of resistivity of a wafer to firstly conduct an oxidation process for the wafer to form the oxidized surface on the wafer, so as to restrict surface variation when placing the wafer in a later process. Therefore, the resistivity measurement of the wafer surface only slightly varies.

The following paragraphs provide detailed description in conjunction with the appended drawing. FIG. 1 shows a flow chart of a measuring method of resistivity of a wafer in an embodiment according to the invention.

The measuring method is adapted to monocrystalline wafer and other types of wafers.

The measuring method of the present invention is adapted to a wafer having resistivity higher than 500 ohm-cm and this is why the measuring method of the present invention may be applied broadly, compared with current technologies.

In the step S1, making and choosing the wafer to be measured.

In an embodiment of the present invention, through the CZ (Czochralski) method, monocrystalline silicon may be grown. Specifically, a semiconductor crystalline growing apparatus may comprise a furnace in which a crucible is placed. A heater heating the crucible is placed outside the crucible. Melted silicon is received in the crucible which is constructed with a graphite crucible receiving a quartz crucible. The graphite crucible receives heat from the heater to melt and transform polysilicon material in the quartz crucible to the melted silicon. Through controlling quantity of dopant put into the crucible, monocrystalline silicon having high resistivity may be grown. Each quartz crucible may be used for a batch of semiconductor grown process, but each graphite crucible may be used for several batches of semiconductor grown process.

A pulling device may be positioned on a top of the furnace. With the pulling device, a seed crystal may pull a silicon ingot out of a liquid surface of the melted silicon.

After forming the silicon ingot, the silicon ingot may be cut into pieces of wafer for choosing the wafer to be measured.

In the step S2, a thermal treatment may be conducted for the wafer to remove a thermal doner in the wafer.

In this step, a great amount of thermal doner may be generated in a cooling process performed after the seed crystal introducing the monocrystalline silicon to increase concentration of carriers for n type of monocrystalline silicon so as to decrease resistivity, recombine concentration of carriers for p type of monocrystalline silicon so as to increase resistivity and eventually transform the p type of monocrystalline silicon to n type of monocrystalline silicon. The effect of thermal doner occurs during a thermal treatment at a low temperature. The quartz crucible is the main resource of oxygen atoms for the monocrystalline silicon. To remove the effect of thermal doner, after choosing the wafer, a process of rapid thermal treatment is required to remove the thermal doner.

The thermal treatment may be rapid thermal treatment.

Optionally, the rapid thermal treatment may be performed at a temperature range of 750° C.-1250° C.

Optionally, the rapid thermal treatment may last for 30 sec to 50 sec.

In an embodiment of the present invention, the temperature to perform the rapid thermal treatment may be 750° C. and the rapid thermal treatment may last for 30 sec.

In the step S3, an oxidation process may be conducted for the wafer to form an oxidized surface on the wafer.

The oxidation process may comprise low temperature heating-up the wafer for a short period to form the oxidized surface on the wafer.

Optionally, the oxidation process may be conducted at 50° C. to 300° C. and the oxidation process may last for 5 min to 3 hr.

In an embodiment of the present invention, the wafer may be placed on a heating station to be heated-up to form a oxidized layer surface on the surface of the wafer.

After heating-up the wafer for the short period, the wafer having high resistivity may be measured its resistivity fast and stably.

Figure 2:
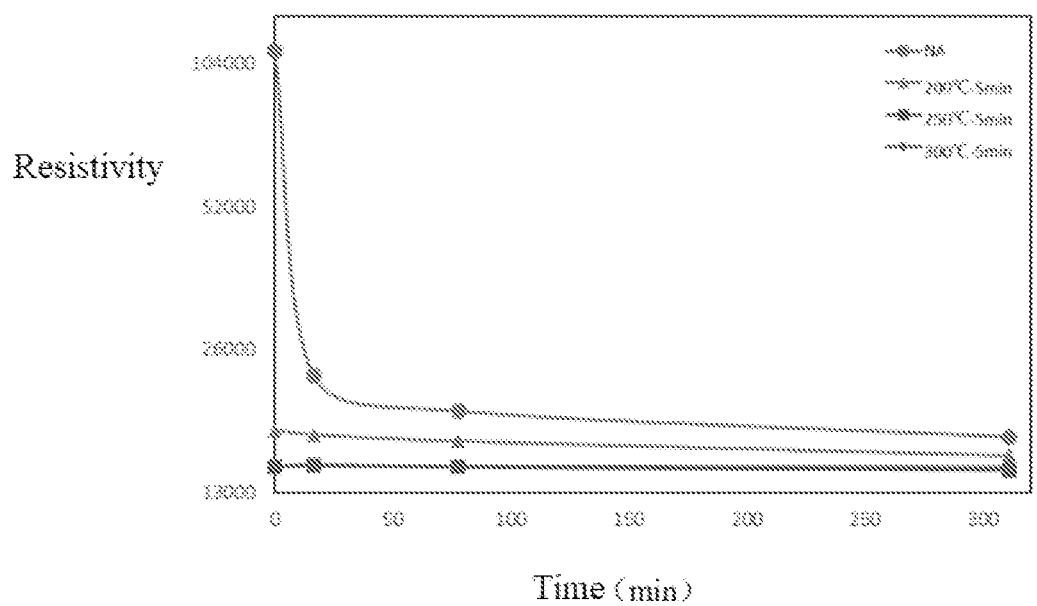
FIG. 2 shows curves of the resistivity of the wafer varied along with time of an embodiment according to the invention.

Specifically, as shown in FIG. 2, the stable oxidized surface may be formed after the low-temperature thermal treatment of the wafer in the air. As such, surface variation may be restricted when placing the wafer in a later process. Therefore, the resistivity measurement of the wafer surface only slightly varies. The method of the present invention may get the stable measurement of resistivity of the high-resistivity wafer with simple operation without high requirements for apparatus in a lower cost.

In the step S4, after the wafer is cooled until a room temperature, the resistivity of the wafer is measured with a four-point probe (4PP) method.

In this step, a collinear four-point probe is used for measuring the resistivity of the wafer. In an embodiment of the present invention, the resistivity of the wafer may be measured in complying with GB/T 1552 standard with the collinear four-point probe to get a first resistivity.

The invention provides a measuring method of resistivity of a wafer to firstly conduct an oxidation process for the wafer to form the oxidized surface on the wafer, so as to restrict surface variation when placing the wafer in a later process. Therefore, the resistivity measurement of the wafer surface only slightly varies. The present invention implements the object to fast obtain stable measurement of resistivity for high-resistivity wafers.

It is readily understood that aforesaid embodiments are only for example but not intended to limit the scope of the present invention. Those skilled in the art may change or modify it without departing from the scope of the annexed claims. All the changes or modifications is comprised by the scope of the annexed claims.

Person having ordinary skilled in the art may understand that units and steps disclosed in the embodiments may be implemented by hardware, software or the combination of hardware and software, depending on specific application and designed conditions. Person having ordinary skilled in the art may implement described function in different ways which is not intended to depart from the scope of the annexed claims.

In the embodiments of the present invention, please note that the disclosed apparatus, device and method may be implemented in other way. The apparatus in the aforesaid embodiment is only for example. For example, dividing units is only logical separation but may be implemented in other way, such as combining or integrating several units or elements into another apparatus, omitting some feature(s) or steps, etc.

A great number of specific details are provided here. However, it is readily understood that the embodiments of the present invention may be implemented without these details. In some embodiment, common knowledge in the art may not be illustrated, and this will not obscure understanding of the present disclosure.

Similarly, it is readily understood that for simplifying the present disclosure and facilitating understanding one or several aspects of the present invention, each feature sometimes may be grouped into a single embodiment, drawing or corresponding description. However, this is not for intension that more features should be included in the present invention, compared with those in the claims. Specifically, as illustrated in the claims, the present invention may be used to solve problem(s) corresponding to a feature used in an embodiment. Therefore, each of the claims may be used as an embodiment of the present invention.

Those skilled in the art may understand that all combinations of features disclosed here (including the annexed claims, abstract and drawings) may be applied without contradiction. Unless a clear illustration is given, equivalents of the same, identical or similar purpose may replace each of the features.

Further, those skilled in the art may understand that despite some features is comprised in some embodiment, not other features, combinations of features mean various embodiments of the present invention. For example, in the claims, any protected embodiment may be used with any combination.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims. In all instances, the scope of such claims shall be considered on their own merits in light of this disclosure, and such claims accordingly define the invention(s), and their equivalents or variations, that are protected thereby. Parenthesis or reference number used in the claims is not intended to limit the scope.

What is claimed is:

1. A measuring method of resistivity of a wafer, comprising:
    choosing a wafer to be measured;
    conducting a thermal treatment for the wafer to remove a thermal doner in the wafer;
    conducting an oxidation process for the wafer to form an oxidized surface on the wafer;
    measuring resistivity of the wafer; and
    cooling the wafer until a room temperature after conducting the oxidation process,
    wherein the resistivity of the wafer exceeds 500 ohm-cm.

2. The measuring method according to claim 1, wherein the thermal treatment is a rapid thermal treatment at a temperature range of 750° C.-1250° C.

3. The measuring method according to claim 2, wherein the thermal treatment lasts for 30 sec to 50 sec.

4. The measuring method according to claim 1, wherein the oxidation process comprises heating-up the wafer for a short period to form the oxidized surface on the wafer.

5. The measuring method according to claim 4, wherein the oxidation process is conducted at 50° C. to 300° C.

6. The measuring method according to claim 4, wherein the oxidation process lasts for 5 min to 3 hr.

7. The measuring method according to claim 1, wherein the resistivity of the wafer is measured with a four-point probe (4PP) method.

8. The measuring method according to claim 1, wherein the wafer is a monocrystalline wafer.

* * * * *